(12) United States Patent
Lee

(10) Patent No.: US 9,360,499 B2
(45) Date of Patent: Jun. 7, 2016

(54) SOCKET FOR TESTING A SEMICONDUCTOR DEVICE AND TEST EQUIPMENT INCLUDING THE SAME

(71) Applicant: Samsung Electronics Co., Ltd., Suwon-Si, Gyeonggi-Do (KR)

(72) Inventor: Youngchul Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 208 days.

(21) Appl. No.: 13/871,275

(22) Filed: Apr. 26, 2013

(65) Prior Publication Data

US 2014/0015559 A1 Jan. 16, 2014

(30) Foreign Application Priority Data

Jul. 12, 2012 (KR) .................. 10-2012-0076266

(51) Int. Cl.
| | | |
|---|---|---|
| *G01R 31/20* | (2006.01) | |
| *H01R 12/00* | (2006.01) | |
| *G01R 1/04* | (2006.01) | |
| *G01R 31/28* | (2006.01) | |
| *G11C 29/56* | (2006.01) | |

(52) U.S. Cl.
CPC .......... *G01R 1/0466* (2013.01); *G01R 31/2808* (2013.01); *G11C 29/56016* (2013.01); *G01R 1/0416* (2013.01); *G01R 31/2817* (2013.01); *G11C 2029/5602* (2013.01)

(58) Field of Classification Search
CPC ...... G01R 1/0466; G01R 31/20; G06K 19/06; H01R 12/52; H01R 12/00; H01R 27/00; H01R 24/00
USPC ........................................ 439/78, 79, 83, 607
See application file for complete search history.

(56) References Cited

U.S. PATENT DOCUMENTS

| | | | |
|---|---|---|---|
| 7,850,465 B1 * | 12/2010 | Wan ..................... H01R 12/712 439/79 |
| 7,899,987 B2 | 3/2011 | Salomon et al. | |
| 7,996,726 B2 | 8/2011 | Ito | |
| 2004/0026516 A1* | 2/2004 | Liu et al. ......................... 235/492 |
| 2008/0160831 A1* | 7/2008 | Sprouse et al. ................ 439/608 |
| 2010/0091596 A1 | 4/2010 | Bang et al. | |
| 2010/0203751 A1* | 8/2010 | Tsai ............................... 439/222 |
| 2010/0235693 A1* | 9/2010 | Kang et al. ..................... 714/718 |
| 2011/0176864 A1* | 7/2011 | Shin et al. ....................... 403/270 |
| 2012/0015554 A1* | 1/2012 | Tseng ................. H01R 13/6658 439/607.01 |
| 2012/0052731 A1* | 3/2012 | Hsiao ................. H01R 13/6658 439/660 |

FOREIGN PATENT DOCUMENTS

| | | | |
|---|---|---|---|
| KR | 1998025603 | 5/1998 | |
| KR | 20090039442 A | 4/2009 | |
| KR | 10-0902668 B1 | 6/2009 | |
| KR | 10-0919394 B1 | 9/2009 | |
| KR | 10-0925992 B1 | 11/2009 | |
| KR | 20090123410 A | 12/2009 | |
| KR | 100934972 * | 1/2010 | ............. H01R 33/76 |
| KR | 10-0979248 B1 | 9/2010 | |
| KR | 10-0999565 B1 | 12/2010 | |

* cited by examiner

*Primary Examiner* — Tung X Nguyen
*Assistant Examiner* — Neel Shah
(74) *Attorney, Agent, or Firm* — Harness, Dickey & Pierce, P.L.C.

(57) ABSTRACT

A test socket has a housing with an inlet configured to receive a substrate. A plurality of terminals are coupled to the housing, and a plurality of sliding pins are coupled to the terminals. The pins are configured to make contact with respective pads or terminals of the substrate to be tested. The pins have different lengths or positions to send and receive test signals.

19 Claims, 9 Drawing Sheets

SOCKET FOR TESTING A SEMICONDUCTOR DEVICE AND TEST EQUIPMENT INCLUDING THE SAME

CROSS-REFERENCE TO RELATED APPLICATIONS

This U.S. non-provisional patent application claims priority under 35 U.S.C. §119 to Korean Patent Application No. 10-2012-0076266, filed on Jul. 12, 2012, in the Korean Intellectual Property Office, the entire contents of which are hereby incorporated by reference.

BACKGROUND

1. Field

Example embodiments of the inventive concept relate to a socket for electrically testing semiconductor devices and test equipment including the same.

2. Related Art

Generally, semiconductor memory devices may be classified into a volatile memory devices and non-volatile memory devices. Non-volatile memory devices include non-volatile memory cells capable of preserving stored data without a power supply.

A solid-state drive (SSD) is configured to include a plurality of non-volatile memory chips (e.g., NAND FLASH chips), and thereby stores a large capacity of data. Recently, due to a decreasing bit cost of SSD, hard-disk drives (HDD) have been replaced by SSD. To improve productivity in fabrication of SSDs, a testing process may be executed on a plurality of SSDs in a batch manner.

SUMMARY

Example embodiments of inventive concepts correspond to a test socket capable of improving reliability of a testing process and test equipment including the same.

According to example embodiments of the inventive concepts, a test socket may include a socket housing with an inlet, in which a substrate may be inserted, a plurality of terminals spaced apart from the inlet and provided in the socket housing, and a plurality of sliding pins fixed to the terminals to have at least two different lengths in the inlet.

In example embodiments, the sliding pins may include first sliding pins extending from the terminals toward the inlet by a first distance, and second sliding pins extending from the terminals toward the inlet by a second distance. The second sliding pins may be provided between and spaced apart from the first sliding pins, and the second distance may be greater than the first distance.

In example embodiments, the socket housing may include a lower housing supporting the terminals and an upper housing combined to the lower housing.

In example embodiments, the upper housing may include spacers separating the first sliding pins from the second sliding pins.

In example embodiments, the test socket may further include guide blocks combined to the upper housing, the first guide blocks extending from the spacers to the outside of the inlet to guide the substrate into the inlet.

In example embodiments, the test socket may further include a terminal block provided between the upper housing and the lower housing to separate the terminals from each other.

In example embodiments, the first sliding pins may be connected to upper portions of the terminals.

In example embodiments, the second sliding pins may be connected to lower portions of the terminals.

According to example embodiments of the inventive concepts, a test equipment may include a chamber, a drawer configured to contain a substrate in the chamber, a socket to be connected to the substrate in the drawer, and a tester configured to test electrically the substrate. The socket may include a socket housing with an inlet, in which a substrate may be inserted, a plurality of terminals spaced apart from the inlet and provided in the socket housing, and a plurality of sliding pins fixed to the terminals to have at least two different lengths in the inlet.

In example embodiments, the drawer may include a plate supporting the substrate, and the plate may include fastening pins configured to align the substrate.

In example embodiments, the plate may further include guide pins aligned to the socket.

In example embodiments, the socket may further include a guide block provided with guide holes, in which the guide pins may be engaged.

In example embodiments, the guide block may be provided at an edge portion of the socket housing.

In example embodiments, the drawer may further include guide bars provided at both sides of the plate to extend parallel to the guide pins.

In example embodiments, the test equipment may further include an interconnector connecting the socket to the tester.

In another example embodiment, a testing apparatus comprises a housing with an inlet configured to receive a printed circuit board; a plurality of terminals in the inlet of the socket; and a plurality of pins coupled to respective ones of the terminals, the plurality of pins including a first number of the pins at a first position and a second number of pins at a second position different from the first position, the first and second numbers of pins configured to be coupled to terminals of the printed circuit board during testing.

At least one of the first number of pins or the second number of pins are sliding pins. Alternatively, or additionally, the first number of pins has a first length corresponding to the first position, and the second number of pins has a second length corresponding to the second position, the first length different from the second length.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

Figure 1:
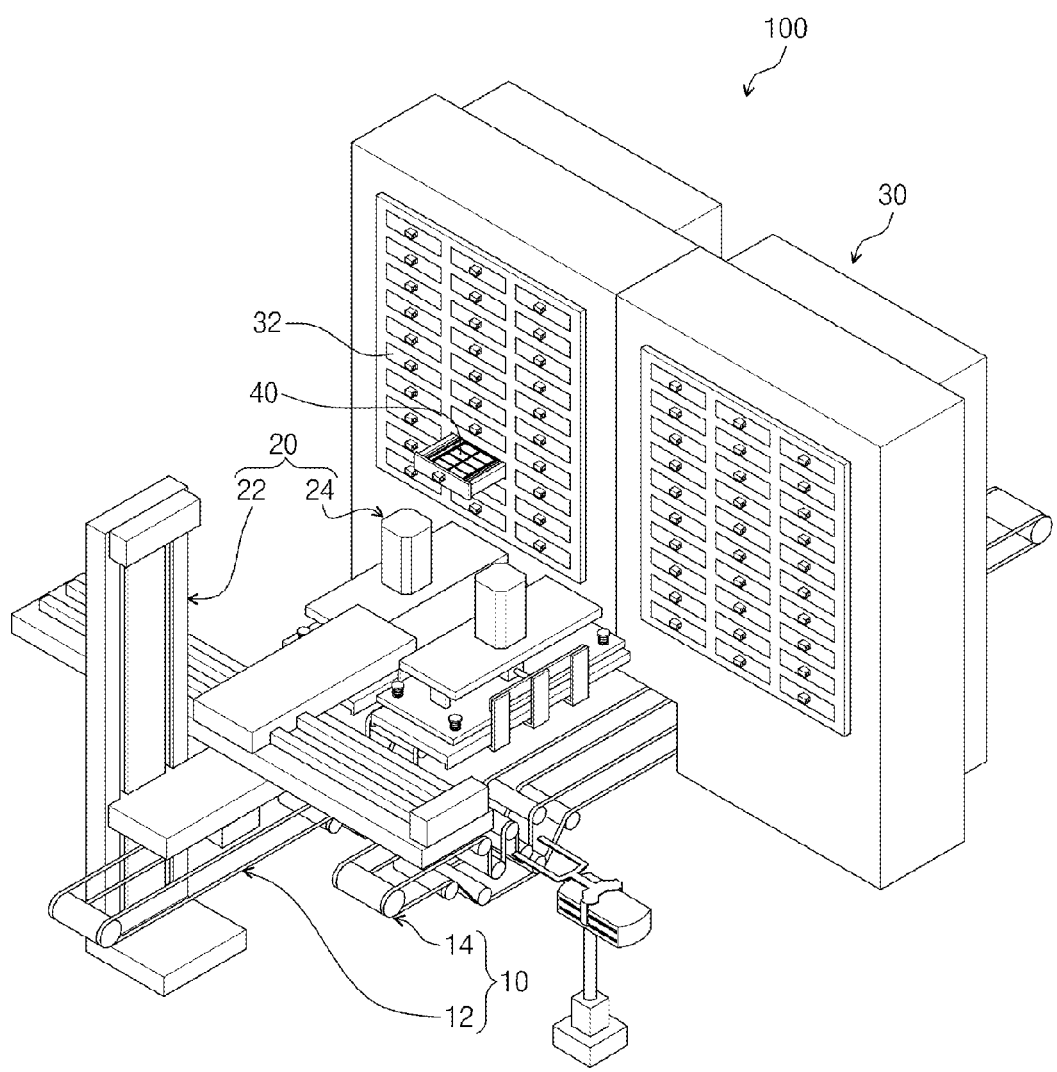
FIG. 1 is a perspective view of a test equipment according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of inventive concepts will now be described more fully with reference to the accompanying drawings, in which example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

In the drawings, it is understood that the thicknesses of layers and regions may be exaggerated for clarity. It will also be understood that when a layer is referred to as being "on" another layer or substrate, it can be directly on the other layer or substrate or intervening layers may also be present. Like reference numerals in the drawings denote like elements, and thus their description will not be repeated. Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of an example embodiment of test equipment according to the inventive concept. Referring to FIG. 1, test equipment 100 according to example embodiments of the inventive concept may include a conveyor unit 10, a transporting unit 20, and a test handler unit 30.

The conveyor unit 10 may be configured to deliver an arrayed printed circuit board (PCB) 40. The conveyor unit 10 may include a supplying conveyor 12 and an exhausting conveyor 14. The supplying conveyor 12 may be configured to deliver the arrayed PCB 40 to the transporting unit 20, and the exhausting conveyor 14 may be configured to deliver the arrayed PCB 40 from the transporting unit 20 back to an unloader.

The transporting unit 20 may be configured to load or unload the arrayed PCB 40 to or from the test handler unit 30.

The transporting unit 20 may include a lift unit 22 and a robot unit 24. The lift unit 22 may be configured to elevate the arrayed PCB 40 from the supplying conveyor 12 to the robot unit 24. Using the robot unit 24, the arrayed PCB 40 may be delivered between the lift unit 22 and the test handler unit 30.

The test handler unit 30 may be configured to provide an environment and a space for testing the arrayed PCB 40. The test handler unit 30 may include a drawer 32 in which the arrayed PCB 40 may be contained. The robot unit 24 may be configured to open and close the drawer 32 of the test handler unit 30.

Figure 2:
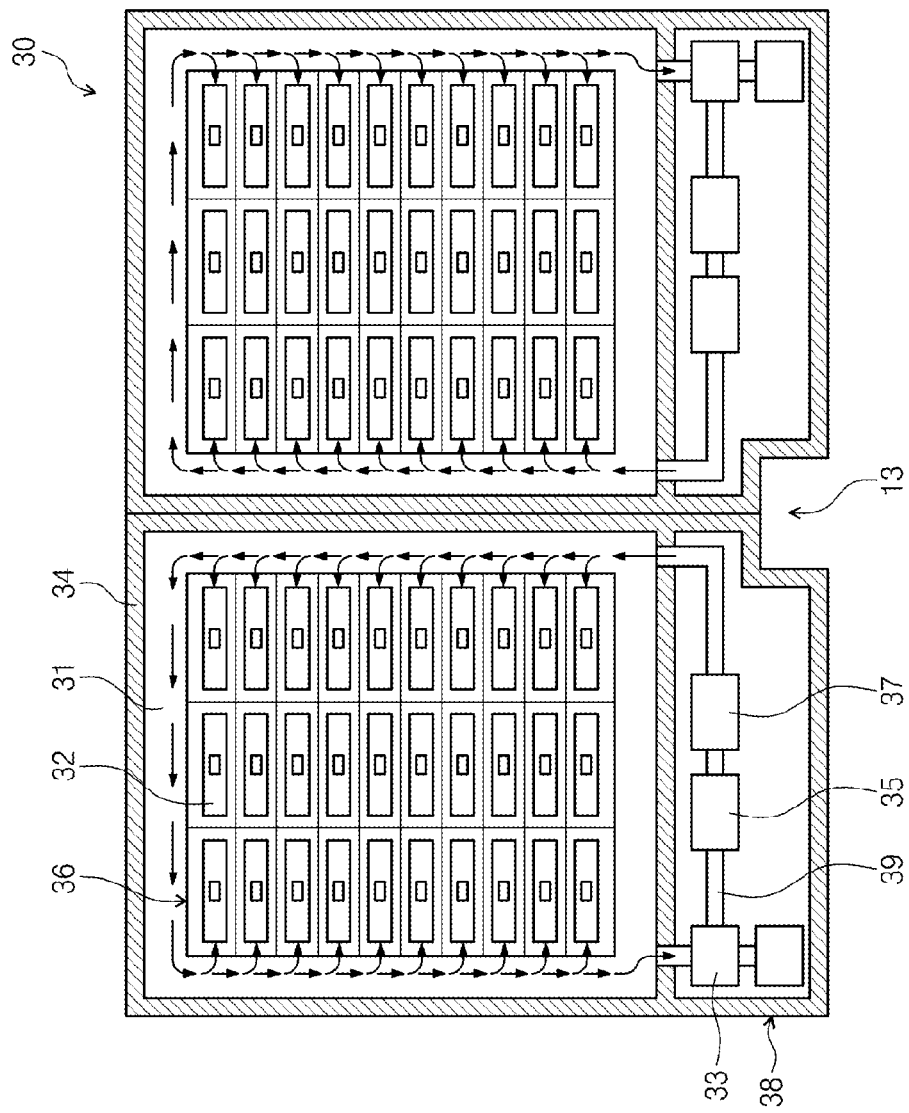
FIG. 2 shows an internal structure of a test handler unit.
Figure 3:
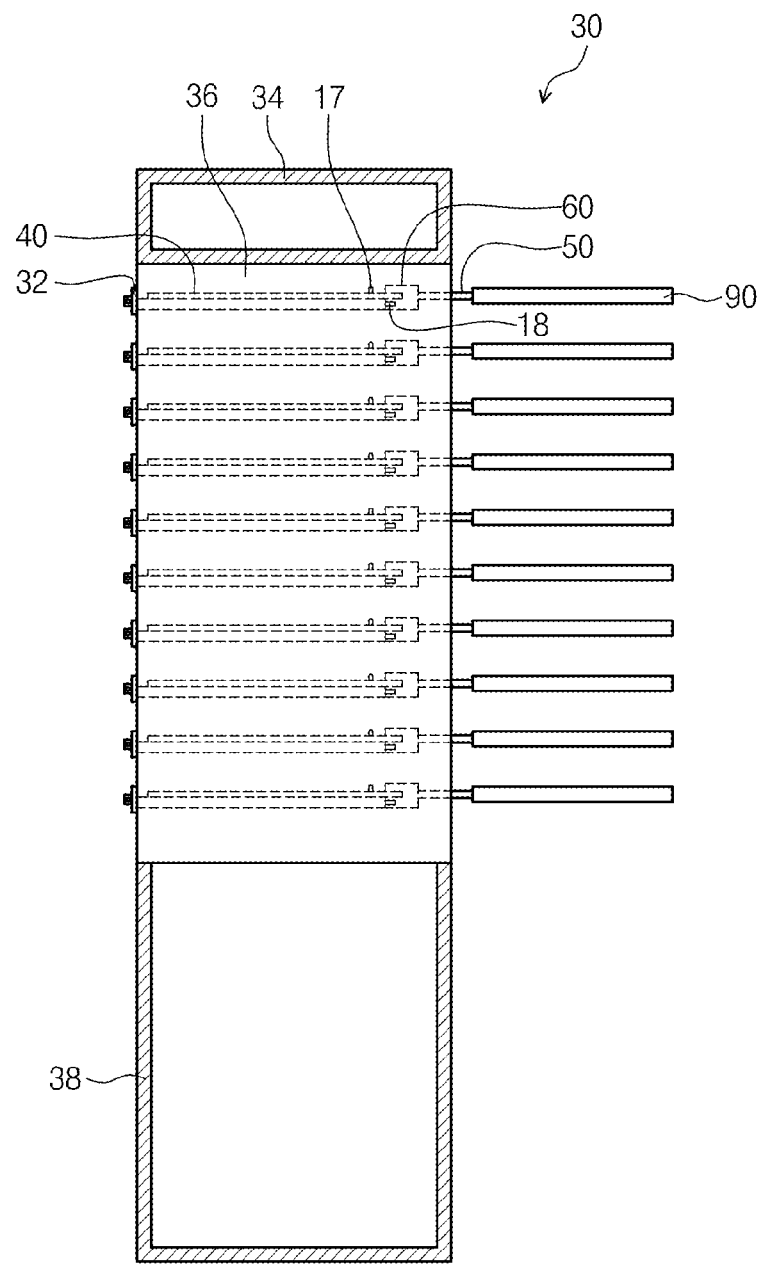
FIG. 3 is a side view of FIG. 2.

FIG. 2 is a diagram illustrating an internal structure of the test handler unit 30, and FIG. 3 is a side view of FIG. 2. Referring to FIGS. 2 and 3, the test handler unit 30 may include an outer chamber 34, an inner chamber 36, and a temperature-controlling chamber 38.

The outer chamber 34 may be configured to surround the inner chamber 36. An air circulation pathway 31 may be provided between the outer chamber 34 and the inner chamber 36. The air circulation pathway 31 may be connected to the temperature-controlling chamber 38 through conduits 39.

The temperature-controlling chamber 38 may be provided below the outer chamber 34. In example embodiments, a ventilator 33, a heater 35, and a condenser/cooler 37 may be provided in the temperature-controlling chamber 38. The ventilator 33, and the heater 35, and condenser/cooler 37 may be connected to the conduits 39. Referring to FIGS. 1 and 2, the exhausting conveyor 14 may be disposed in a pathway 13, which may be provided between the temperature-controlling chambers 38.

The inner chamber 36 may be configured to include a plurality of the drawers 32. Each of the drawers 32 may be configured to contain an arrayed PCB 40. In example embodiments, the drawers 32 may be provided to form M×N matrix-shaped arrangement (M and N are natural numbers). For example, as shown in FIG. 2, the test handler unit 30 may include a pair of the inner chambers 36, each of which is configured to contain 30 drawers 32. In example embodiments, the drawers 32 may have the same structure. Example embodiments of the inventive concepts may not be limited to the example embodiment, shown in FIGS. 1 and 2, in which two inner chambers 36 are provided.

Referring back to FIGS. 1 and 3, the arrayed PCB 40 may be inserted into a test socket 60, when the drawer 32 is closed, and be tested. The arrayed PCB 40 may be unloaded from the drawer 32, when the drawer 32 is open, and another of the arrayed PCBs 40 may be inserted into the test socket 60 to take its place.

Figure 4:
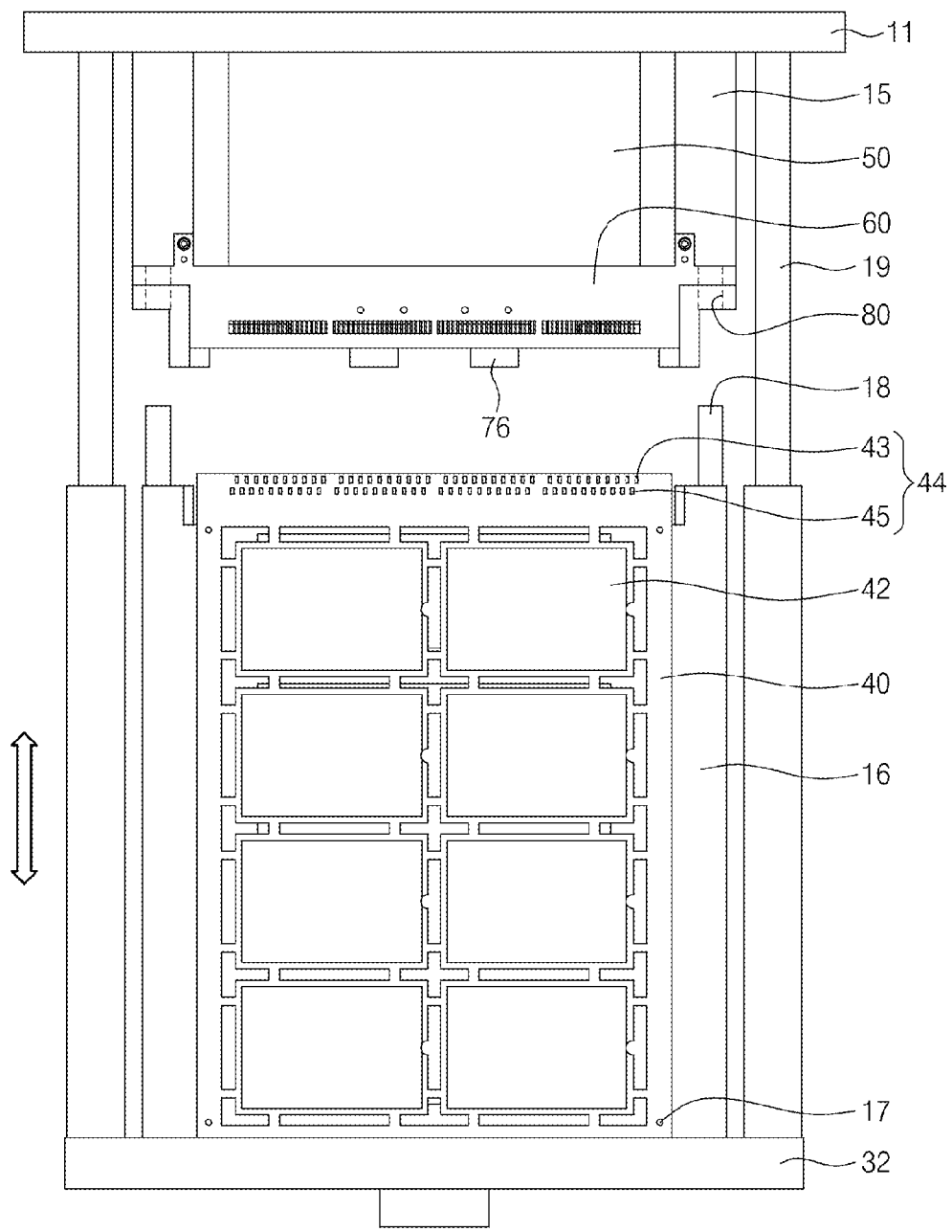
FIGS. 4 and 5 are plan and perspective views illustrating an arrayed printed-circuit board and a test socket of FIG. 3.
Figure 5:
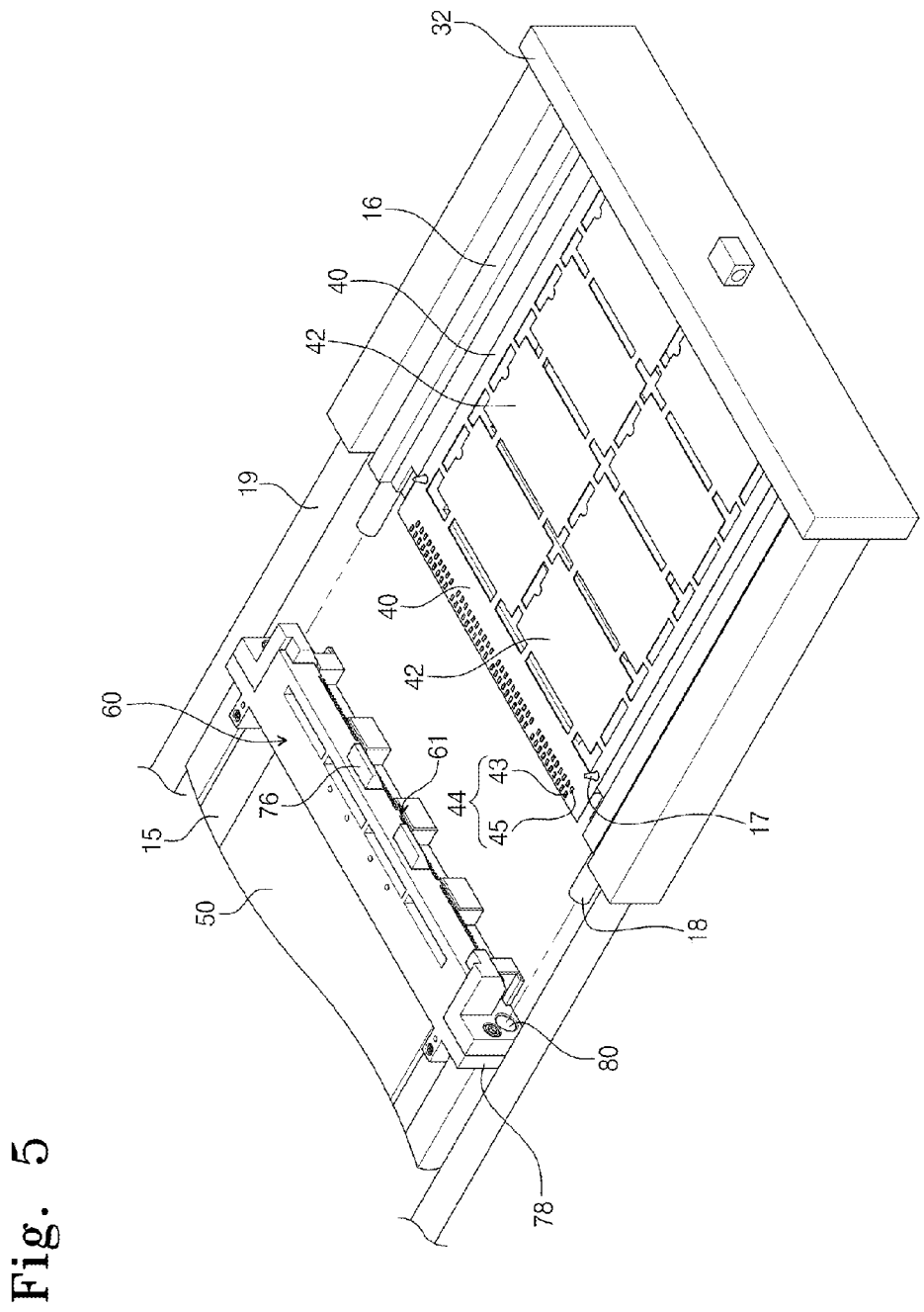

FIGS. 4 and 5 are plan and perspective views illustrating the arrayed PCB 40 and the test socket 60 of FIG. 3. Referring to FIGS. 3 through 5, when the drawer 32 is closed, the arrayed PCB 40 may be inserted into a substrate inlet 61 of the test socket 60. The drawer 32 may include a plate 16 and guide bars 19. The plate 16 may be configured to support the arrayed PCB 40.

The guide bars 19 may be configured to define a boundary of region, in which the plate 16 can be moved. The guide bars 19 may be provided at both sides of the plate 16. Due to the presence of the guide bars 19, the plate 16 may be reciprocated within a specific distance from a sidewall 11 of the inner chamber 36. But example embodiments of the inventive concepts may not be limited thereto. For example, the guide bars 19 may be used as a guide rail or a guide line assisting the reciprocal movement of the plate 16.

The plate 16 may be bigger than the arrayed PCB 40 and have a rectangular plan shape. The plate 16 may include fastening pins 17 and guide pins 18. The fastening pins 17 and the guide pins 18 may be provided at an edge portion of the plate 16. For example, the plate 16 may have four fastening pins 17. The fastening pins 17 may be inserted into substrate holes. The fastening pins 17 may be used to align the arrayed PCBs 40 on the plate 16.

The guide pins 18 may be provided at end portions of both sides of the plate 16 adjacent to the test socket 60. The guide pins 18 may be inserted into guide holes 80 of second guide blocks 78. The second guide blocks 78 may be provided at both edge portions of the test socket 60. Accordingly, the guide pins 18 may be used to align the arrayed PCB 40 to the test socket 60.

The arrayed PCB 40 may have a rectangular plan shape. A plurality of unit substrates 42 may be provided in the arrayed PCB 40. For example, the arrayed PCB 40 may include about eight unit substrates 42. The unit substrates 42 may be provided to form a 2×4 arrangement on the arrayed PCB 40. But example embodiments of the inventive concepts may not be limited thereto. For example, the unit substrates 42 may be provided to form an M×N arrangement on the arrayed PCB 40, where M and N are natural numbers. In example embodiments, each of the unit substrates 42 may be a solid state drive (SSD).

The arrayed PCB 40 may include pads 44. The pads 44 may be provided on the arrayed PCB 40 to satisfy the standard of Joint Test Action Group (JTAG) prescribing how to test the unit substrates 42 on the arrayed PCB 40 without a direct physical contact to the unit substrates 42 (e.g., using test probes). For example, according to JTAG, 2×7 or 2×5 pads 44 may be allocated to each unit substrate 42. Accordingly, as the number of the unit substrates 42 mounted on the arrayed PCB 40 increases, the number of the pads 44 may increase.

The pads 44 may be provided at an edge portion of the arrayed PCB 40. In an example embodiment, the pads 44 may be electrically connected to the solid state drives. The pads 44 may be grouped into a plurality of pad blocks. For example, the pads 44 may be arranged at an edge portion of the arrayed PCB 40 to form two columns. The pads 44 may include first pads 43 and second pads 45. The first pads 43 may be provided at an edge portion of the arrayed PCB 40. The second pads 45 may be provided at a portion of the arrayed PCB 40 spaced apart from the edge portion, compared with the first pads 43.

The first pads 43 and the second pads 45 may be provided on the arrayed PCB 40 to form a zigzag arrangement. For example, the first pads 43 may be connected to a receiver (Rx), while the second pads 45 may be connected to a transmitter (Tx). The first pads 43 and the second pads 45 may be configured in such a way that a high current of about 6 A can be applied thereto.

The test socket 60 may be fixed to a sidewall 11 of the inner chamber 36 by rods 15. An interconnector 50 may be provided between the test socket 60 and the sidewall 11. A first guide block may be further provided, as will be described in more detail with reference to FIG. 7.

Figure 6:
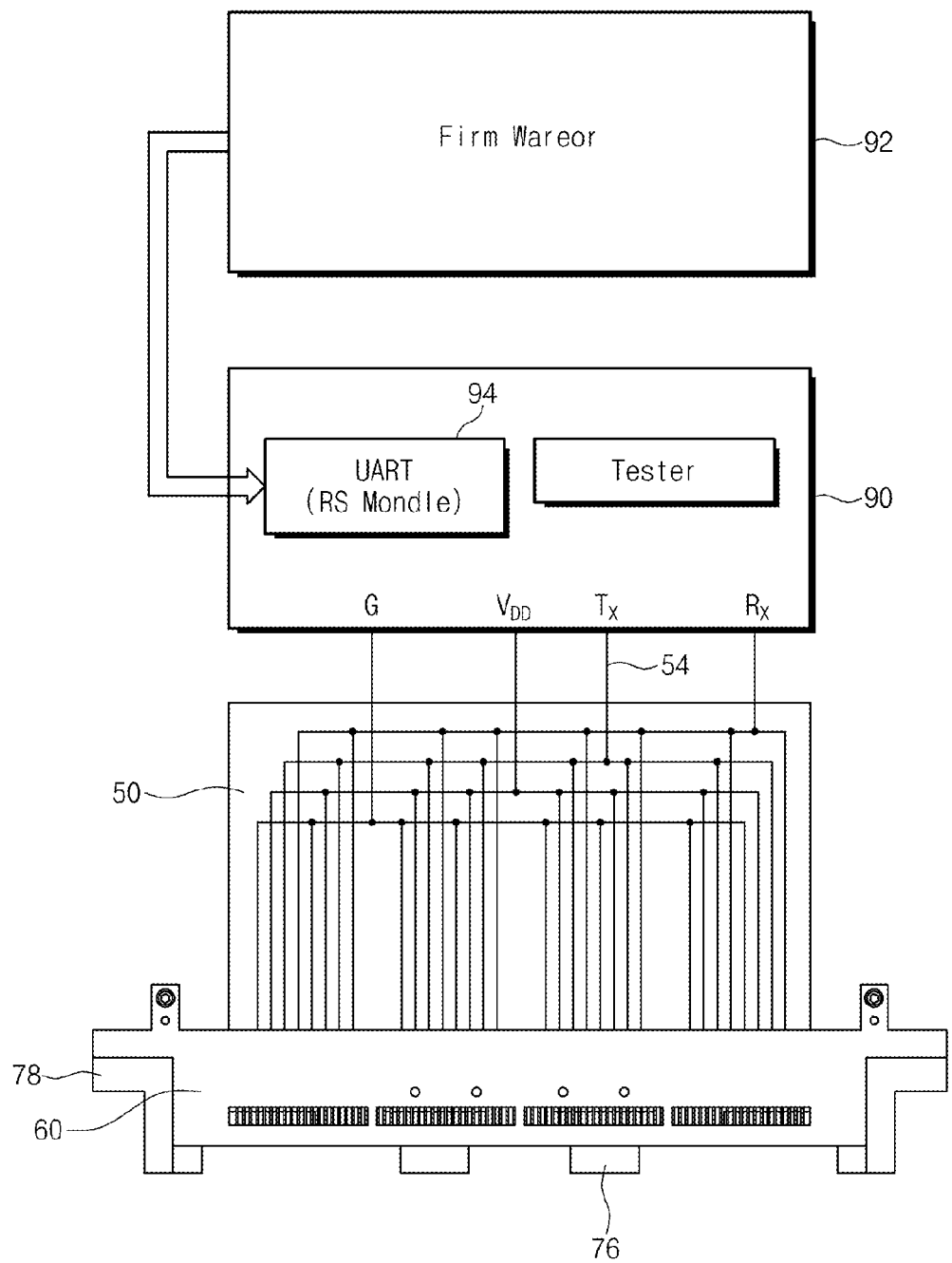
FIG. 6 is a diagram illustrating a connection between a test socket and a tester of FIG. 3.

FIG. 6 is a diagram illustrating a connection between the test socket 60 and a tester 90 of FIG. 3. Referring to FIGS. 3 and 6, the test socket 60 may be connected to the tester 90 via the interconnector 50.

The tester 90 may be configured to output control signals to the unit substrates 42. The tester 90 may be operated in response to an input signal from a firmware 92 or a computer. The tester 90 may be configured to include a universal asynchronous receiver and transmitter (UART) 94. The UART 94 may be configured to execute a serial-parallel data conversion required for an asynchronous communication. The UART 94 may include a transmitted data register T×D, a received data register RxD, a control register, and a baud rate register. The tester 90 may receive output signals from the unit substrates 42.

In example embodiments, the tester 90 may include a ground terminal G, a power terminal Vdd, a transmitter T, and a receiver R. Output wires 54 of the tester 90 may be branched in the interconnector 50, and the interconnector 50 may connect the test socket 60 to the tester 90.

Figure 7:
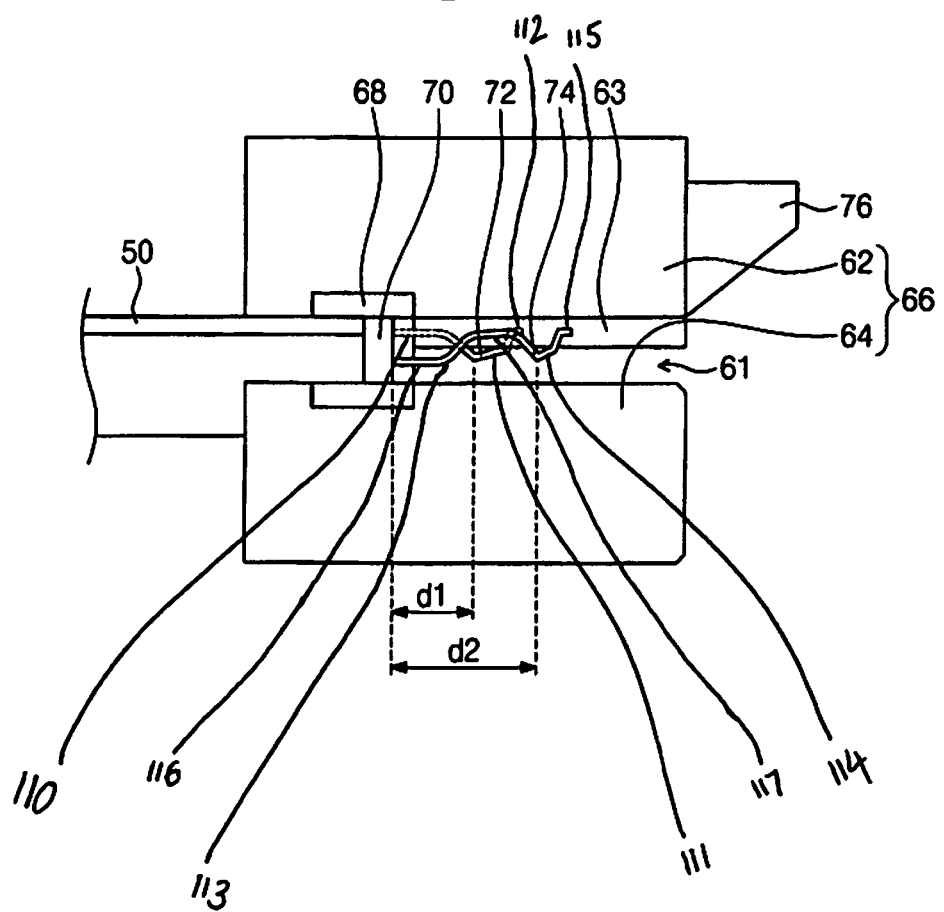
FIG. 7 is a sectional view of a test socket.
Figure 8:
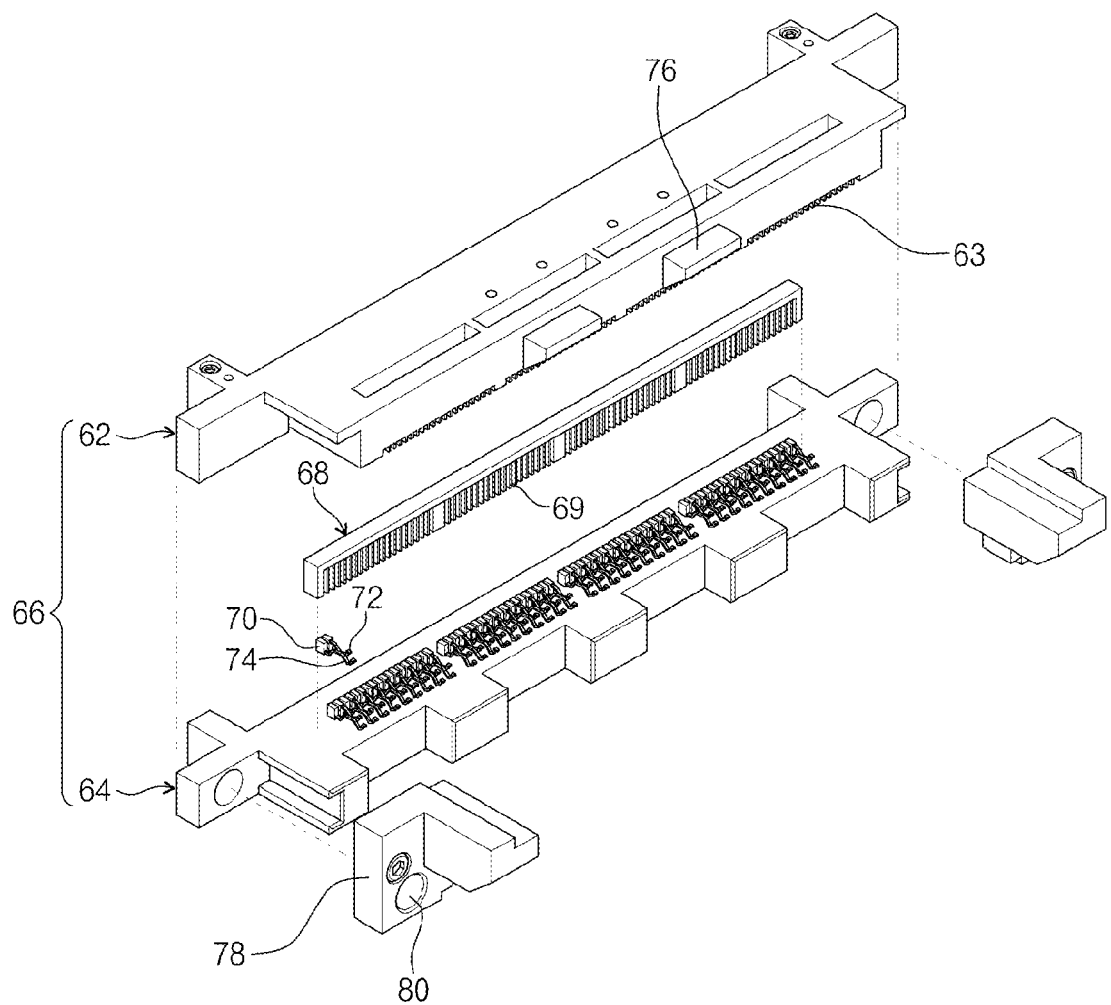
FIG. 8 is an exploded perspective view of a test socket.

FIG. 7 is a sectional view of the test socket 60, and FIG. 8 is an exploded perspective view of the test socket 60. Referring to FIGS. 7 and 8, the test socket 60 may include a socket housing 66, the first guide blocks 76, the second guide blocks 78, a terminal block 68, terminals 70, first sliding pins 72, and second sliding pins 74.

The socket housing 66 may include an upper housing 62 and a lower housing 64. The upper housing 62 may cover the terminal block 68, the terminals 70, the first sliding pins 72, and the second sliding pins 74. The first sliding pins 72 and the second sliding pins 74 may be provided in the upper housing 62. The first sliding pins 72 and the second sliding pins 74 may be elevated or lowered in the upper housing 62.

The upper housing 62 may include first spacers 63 provided between the first sliding pins 72 and the second sliding pins 74. Accordingly, the first sliding pins 72 and the second sliding pins 74 may be spaced apart from each other by the first spacers 63. In example embodiments, the first sliding pins 72 and the second sliding pins 74 may be electrically separated from each other by the first spacers 63.

The lower housing 64 may be configured to support the terminal block 68 and the terminals 70. The lower housing 64 may be engaged with the upper housing 62 to form a substrate inlet 61. The substrate inlet 61 may be provided at a front side of the socket housing 66. The interconnector 50 may be connected to a rear side of the socket housing 66. The substrate inlet 61 may be formed to have a thickness greater than that of the arrayed PCB 40.

The first guide blocks 76 may be used to insert the arrayed PCB 40 into the substrate inlet 61 with maintaining horizontality. The upper housing 62 may support the first guide blocks 76. The first guide blocks 76 may be provided adjacent to the spacer 63 and be combined to the upper housing 62. The first guide blocks 76 may be shaped to have a curved surface connected to the substrate inlet 61. The first guide blocks 76 may extend from the spacer 63 toward the outside of the substrate inlet 61. In general, the arrayed PCB 40 may be bent within a range of about 3 mm. The first guide block 76 may be configured to press the arrayed PCB 40 toward the lower housing 64. Accordingly, the first guide blocks 76 may prevent the arrayed PCB 40 from being bowed.

The second guide blocks 78 may be combined to both edge portions of the lower housing 64, respectively. The second guide blocks 78 may be provided at the front side of the socket housing 66. The lower housing 64 may fix the second guide blocks 78. The second guide blocks 78 may include the guide holes 80. The guide holes 80 may be engaged with the guide pins 18.

The terminal block 68 may be provided between the upper housing 62 and the lower housing 64. The terminal block 68 may be spaced apart from the substrate inlet 61. The terminal block 68 may be configured to fix the terminals 70. The terminals 70 may be provided in the terminal block 68. The terminal block 68 may include second spacers 69. The second spacers 69 may be provided to separate the terminals 70 from each other.

The terminals 70 may be configured to fix the first sliding pins 72 and the second sliding pins 74. For example, the first sliding pins 72 may be fixed to upper portions of the terminals 70, while the second sliding pins 74 may be fixed to lower portions of the terminals 70. The first sliding pins 72 and the second sliding pins 74 may extend from the terminals 70 to the substrate inlet 61.

The first sliding pins 72 and the second sliding pins 74 may be formed of at least one metallic material such as, gold, copper, nickel, or cobalt. Each of the first sliding pins 72 and the second sliding pins 74 may be configured to include a spring pin.

In example embodiments, the first sliding pins 72 may be shorter than the second sliding pins 74. The first sliding pins 72 may extend to a position spaced apart from the terminals 70 by a first distance d1. The second sliding pins 74 may be provided between the first sliding pins 72. The second sliding pins 74 may extend to a position spaced apart from the terminals 70 by a second distance d2. In example embodiments, in addition to the first and second sliding pins 72 and 74, the test socket 60 may further include two or more sliding pins, whose lengths are different from those of the first and second sliding pins 72 and 74.

Figure 9:
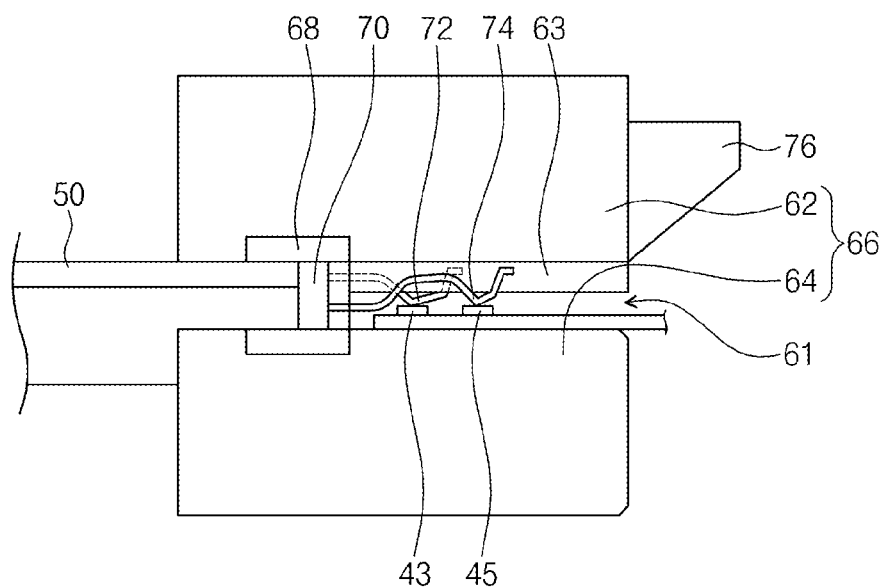
FIG. 9 is a sectional view illustrating an arrayed printed circuit board inserted into the substrate inlet of FIG. 7.

FIG. 9 is a sectional view illustrating the arrayed PCB 40 inserted into the substrate inlet 61 of FIG. 7. Referring to FIGS. 5 and 9, the first sliding pins 72 may be connected to the first pads 43. The first sliding pins 72 may be configured to be able to send transmission data from the tester 90 to the arrayed PCB 40. The second sliding pins 74 may be provided to pass between the first pads 43. The second sliding pins 74 may be connected to the second pads 45.

A space between the first pads 43 may be greater than a width of each second sliding pin 74. For example, the first sliding pins 72 and the second sliding pins 74 may be formed to have a width of about 0.7 mm or less. On the arrayed PCB 40, the first pads 43 may be provided spaced apart from each other with a space of 0.7 mm or more. The second sliding pins 74 may be provided to pass the first pads 43. The first pads 43 may have a separation margin greater than a width of each second sliding pin 74. Accordingly, the separation margin between the first pads 43 may correspond to a width margin of the second sliding pins 74.

In an example embodiment, as shown in FIG. 7, references 110, 111, and 112 represent a first extension region, a first sliding region and a first end region of the sliding pin 72, respectively. References 113, 114, and 115 represent a second extension region, a second sliding region and a second end region of the sliding pin 74, respectively. References 116 and 117 represent a lower extension region and an upper extension region of the sliding pin 74, respectively.

The separation margin between the first pads 43 and the second pads 45 may be determined based on a difference in length between the first sliding pins 72 and the second sliding pins 74. There may be a voltage difference of about 1V-5V between the first sliding pins 72 and the second sliding pins 74. In addition, the first sliding pins 72 or the second sliding pins 74 may be configured in such a way that a high current of about 6 A or more passes through the first sliding pins 72 or the second sliding pins 74.

The greater a length difference between the first and second sliding pins 72 and 74, the greater the separation margin between the first and second pads 43 and 45. According to example embodiments of the inventive concept, it is possible to reduce or minimize electric interference between the first and second pads 43 and 45. Accordingly, the test socket 60 and the test equipment 100 with the same can provide improved reliability for a test process.

Since the pads 44 are provided with an increased separation margin, the number of the unit substrates 42 to be mounted on the arrayed PCB 40 can be increased. Accordingly, it is possible to increase productivity of the test socket 60 and the test equipment 100 with the same.

According to example embodiments of the inventive concept, a test socket may include first sliding pins and second sliding pins. The first and second sliding pins may be configured to have at least two different lengths in a socket housing from terminals toward a substrate inlet. An arrayed PCB may be inserted into the substrate inlet.

The arrayed PCB may include first pads and second pads that are arranged at different distances from an edge of the arrayed PCB. The first pads and the second pads may have a separation margin corresponding to the difference in length between the first and second sliding pins. In the case where the difference in length between the first and second sliding pins is increased, it is possible to reduce electric interference between the first and second pads. Accordingly, the test socket and the test equipment including the same enable to improve reliability in a process of testing a semiconductor device (e.g., SSD).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A test socket, comprising:
   a socket housing with an inlet configured to receive a substrate;
      a plurality of terminals coupled to the socket housing; and
      a plurality of sliding pins coupled to the terminals, the plurality of sliding pins including a first number of the sliding pins having a first length and a second number of sliding pins having a second length different from the first length, wherein
      each of the first number of the sliding pins includes a first extension region, a first sliding region and a first end region; and
      each of the second number of the sliding pins includes a second extension region, a second sliding region and a second end region, the second extension region including a lower extension region lower than the first extension region and an upper extension region higher than the first sliding region.

2. The test socket of claim 1, wherein the first number is different from the second number.

3. The test socket of claim 1, wherein:
   the first number of first sliding pins extend from the terminals toward the inlet by a first distance; and
   the second number of second sliding pins extend from the terminals toward the inlet by a second distance, wherein the second number of the second sliding pins are provided between and spaced apart from the first number of the first sliding pins in a pattern, and the second distance is greater than the first distance.

4. The test socket of claim 3, wherein the pattern is an alternating pattern.

5. The test socket of claim 3, wherein the first number of sliding pins are connected to upper portions of the terminals.

6. The test socket of claim 3, wherein the second number of sliding pins are connected to lower portions of the terminals.

7. The test socket of claim 1, wherein the socket housing comprises a lower housing supporting the terminals and an upper housing coupled to the lower housing.

8. The test socket of claim 7, wherein the upper housing comprises
   one or more spacers separating the first number of sliding pins from the second number of sliding pins.

9. The test socket of claim 8, further comprising:
   one or more guide blocks coupled to the upper housing,
   the one or more guide blocks extending from the one or more spacers to an outside of the inlet and including at least one surface to guide the substrate into the inlet.

10. The test socket of claim 7, further comprising
    a terminal block provided between the upper housing and the lower housing to separate the terminals from each other.

11. The test socket of claim 1, wherein the first sliding region is between the first extension region and the first end region and lower than the first extension region and the first end region.

12. A test equipment, comprising:
    a chamber;
    a drawer to be received in the chamber and configured to receive a substrate;
    a tester configured to test electrically the substrate; and
    a socket configured to be removably connected to the substrate in the drawer, the socket comprising
    a socket housing with an inlet configured to receive the substrate;
    a plurality of terminals spaced apart from the inlet and provided in the socket housing; and
    a plurality of sliding pins coupled to the terminals, the plurality of sliding pins including a first number of the sliding pins having a first length and a second number of sliding pins having a second length different from the first length wherein,
    each of the first number of the sliding pins includes a first extension region, a first sliding region and a first end region; and
    each of the second number of the sliding pins includes a second extension region, a second sliding region and a second end region, the second extension region including a lower extension region lower than the first extension region and an upper extension region higher than the first sliding region.

13. The test equipment of claim 12, wherein
    the drawer comprises a plate configured to support the substrate,
    the plate including one or more fastening pins configured to align the substrate.

14. The test equipment of claim 13, wherein the plate further comprises one or more guide pins in substantial alignment with the socket.

15. The test equipment of claim 14, wherein the socket further comprises
    a guide block including one or more guide holes,
    the one or more guide pins coupled to the one or more guide holes respectively.

16. The test equipment of claim 15, wherein the guide block is provided at an edge portion of the socket housing.

17. The test equipment of claim 14, wherein the drawer further comprises one or more guide bars adjacent the plate which extend parallel to the one or more guide pins.

18. The test equipment of claim 12, further comprising an interconnector connecting the socket to the tester.

19. A testing apparatus comprising:
    a housing with an inlet configured to receive a printed circuit board;
    a plurality of terminals in the inlet of the socket; and a plurality of pins coupled to respective ones of the terminals, the plurality of pins including a first number of the pins at a first position and a second number of pins at a second position different from the first position, the first and second numbers of pins configured to be coupled to terminals of the printed circuit board during testing, wherein the first number of the pins has a first length corresponding to the first position, and the second number of the pins has a second length corresponding to the second position, the first length being different from the second length; wherein, each of the first number of the pins includes a first extension region, a first sliding region and a first end region; and each of the second number of the pins includes a second extension region, a second sliding region and a second end region, the second extension region including a lower extension region lower than the first extension region and an upper extension region higher than the first sliding region.

\* \* \* \* \*